United States Patent
Noh

(10) Patent No.: US 8,669,815 B2
(45) Date of Patent: Mar. 11, 2014

(54) AMPLIFIER, APPARATUS AND METHOD FOR CONTROLLING AMPLIFIER IN COMMUNICATION SYSTEM

(75) Inventor: Youn-Sub Noh, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 104 days.

(21) Appl. No.: 13/005,988

(22) Filed: Jan. 13, 2011

(65) Prior Publication Data

US 2012/0112839 A1    May 10, 2012

(30) Foreign Application Priority Data

Nov. 8, 2010    (KR) .................. 10-2010-0110351

(51) Int. Cl.
*H03F 3/04*    (2006.01)
*H03F 1/30*    (2006.01)

(52) U.S. Cl.
CPC .................. *H03F 1/302* (2013.01)
USPC ......................... 330/296; 330/277

(58) Field of Classification Search
CPC ...... H03F 1/302; H03F 1/301; H03F 2200/18
USPC ......................... 330/277, 296, 285
See application file for complete search history.

(56) References Cited

U.S. PATENT DOCUMENTS

2005/0083131 A1    4/2005    Retelny, Jr.
2009/0251220 A1*   10/2009   Matsuda et al. ............. 330/296

FOREIGN PATENT DOCUMENTS

| JP | 2001-358543 | 12/2001 |
| KR | 10-1999-0047967 | 7/1999 |
| KR | 10-2002-0081655 | 10/2002 |
| KR | 10-0649322 | 11/2006 |

OTHER PUBLICATIONS

Kyeong-Hak Kim et al., "Design and Fabrication of a Ka-Band 10 W Power Amplifier Module", Paper published by the Korean Institute of Electromagnetic Engineering and Science, vol. 20, No. 3, pp. 264-272, Mar. 2009.

* cited by examiner

*Primary Examiner* — Robert Pascal
*Assistant Examiner* — Khiem Nguyen
(74) *Attorney, Agent, or Firm* — Staas & Halsey LLP

(57) ABSTRACT

An apparatus for controlling an amplifier in a communication system includes a first shifter, a generating unit, a second shifter, and a switching bias unit. The first shifter is configured to level-shift a switching voltage of an amplifier to a first voltage. The generating unit is configured to invert the first voltage and output a second voltage. The second shifter is configured to level-shift the second voltage to a third voltage. The switching bias unit is configured to receive the third voltage and output a bias voltage for a gate switching operation of the amplifier to the amplifier.

18 Claims, 3 Drawing Sheets

AMPLIFIER, APPARATUS AND METHOD FOR CONTROLLING AMPLIFIER IN COMMUNICATION SYSTEM

CROSS-REFERENCE(S) TO RELATED APPLICATIONS

The present application claims priority of Korean Patent Application No. 10-2010-0110351, filed on Nov. 8, 2010, which is incorporated herein by reference in its entirety.

BACKGROUND OF THE INVENTION

1. Field of the Invention

Exemplary embodiments of the present invention relate to communication systems; and, more particularly, to an amplifier for amplifying a radio frequency (RF) signal in a communication system, and an apparatus and method for controlling the amplifier.

2. Description of Related Art

Extensive research is being conducted on an amplifier for amplifying signals to a predetermined level in communication systems for stable and normal signal transmission. In particular, with the high integration and miniaturization of semiconductor devices, amplifiers capable of operating stably even in a variable communication environment are being proposed.

In recent communication systems, high-power signals are transmitted in order to stably transmit a large amount of data at a high data rate. Therefore, an amplifier must stably amplify an RF signal and must stably output high-level power. A high power amplifier (HPA) has been proposed as such an amplifier. When an HPA is used to amplify an RF signal in a communication system, the HPA operates at a duty level of 1% to 30%.

A pulse driving scheme is used to drive such an HPA. Examples of the pulse driving scheme include a scheme of switching on/off a drain terminal of the HPA and a scheme of switching on/off a gate terminal of the HPA. A gate bias circuit is used as an HPA driving device.

A communication system uses a plurality of transistor modules for an active phased array, and the miniaturization of the transistor modules is necessary for the miniaturization of the system. That is, for miniaturization of a communication system and miniaturization of a transistor module, an HPA driving device (i.e., a gate bias circuit) must be included in the HPA. If the gate bias circuit is not included in the HPA, it must be included in the transistor module. In this case, the size of the transistor module increases, thus restricting the miniaturization of the system and the miniaturization of the transistor module.

The HPA including the gate bias circuit is driven by switching on/off the drain terminal, because it is not normally driven by switching on/off the gate terminal. That is, in order to drive the HPA including the gate bias circuit, a PWM (Pulse Width Modulation) circuit for switching on/off the drain terminal is included in the transistor module. The size of the transistor module is about 10% of the size of the transistor module, thus restricting the miniaturization of the system and the miniaturization of the transistor module.

In order to overcome the restriction in driving the HPA by the drain terminal on/off scheme, a circuit for turning on/off a gate bias voltage of an FET (Field Effect Transistor) amplifier (i.e., an HPA) and an emitter follower circuit using a BJT (Bipolar Junction Transistor) have been proposed. However, because the circuit for turning on/off a gate bias voltage of an FET amplifier requires additional external devices such as a diode inverter and an operational amplifier, it is difficult to include in the HPA. Also, because the HPA uses an FET device, the emitter follower circuit using a BJT has a limitation on the integration in a single chip. Also, it uses both a positive voltage and a negative voltage to drive the above circuit, thus complicating an external interface.

What is therefore required is an amplifier for stably amplifying an RF signal to a high power in a communication system, and an amplifier controlling scheme that is implemented in the amplifier, thus making it possible to simplify an external interface, reduce the size of a transistor module and reduce the complexity and size of the entire system.

SUMMARY OF THE INVENTION

An embodiment of the present invention is directed to an amplifier for amplifying a radio frequency (RF) signal in a communication system, and an apparatus and method for controlling the amplifier.

Another embodiment of the present invention is directed to an amplifier for stably amplifying an RF signal to a high power in a communication system, and an amplifier controlling apparatus and method that is implemented in the amplifier to normally control the amplifier.

Another embodiment of the present invention is directed to an amplifier for stably amplifying an RF signal to a high power in a communication system, and an amplifier controlling apparatus and method that is implemented in the amplifier, thus making it possible to simplify an external interface, reduce the size of a transistor module and reduce the complexity and size of the entire system.

Another embodiment of the present invention is directed to an amplifier for amplifying an RF signal in a communication system without using additional external devices and power supply, which is integrated to the minimum size in a single chip, and an apparatus and method for controlling the amplifier.

Other objects and advantages of the present invention can be understood by the following description, and become apparent with reference to the embodiments of the present invention. Also, it is obvious to those skilled in the art to which the present invention pertains that the objects and advantages of the present invention can be realized by the means as claimed and combinations thereof.

In accordance with an embodiment of the present invention, an apparatus for controlling an amplifier in a communication system includes: a first shifter configured to level-shift a switching voltage of an amplifier to a first voltage; a generating unit configured to invert the first voltage and output a second voltage; a second shifter configured to level-shift the second voltage to a third voltage; and a switching bias unit configured to receive the third voltage and output a bias voltage for a gate switching operation of the amplifier to the amplifier.

In accordance with another embodiment of the present invention, an amplifier in a communication system includes: an amplifying unit configured to amplify a radio frequency (RF) signal to a high power; and a driving unit configured to apply a bias voltage to a gate terminal of the amplifying unit for a gate switching operation of the amplifying unit, wherein the amplifying unit and the driving unit are included in a Monolithic Microwave Integrated Circuit (MMIC); the amplifying unit receives a positive voltage through a drain voltage terminal for the gate switching operation, receives a switching voltage through a switching terminal, and receives a negative voltage through the gate voltage terminal; and if the switching voltage is at a high level, the driving unit applies the bias voltage, which is higher than a threshold voltage of the transistor included in the amplifying unit, to normally operate the amplifying unit, and if the switching voltage is at a low level, the driving unit applies the bias voltage lower than the threshold voltage not to operate the amplifying unit.

In accordance with another embodiment of the present invention, a method for controlling an amplifier in a communication system includes: level-shifting a switching voltage for a gate switching operation of an amplifier; inverting the level-shifted switching voltage; level-shifting the inverted switching voltage; generating a bias voltage for driving the gate switching operation of the amplifier by the control of the inverted and level-shifted switching voltage; and applying the generated bias voltage to the amplifier.

DESCRIPTION OF SPECIFIC EMBODIMENTS

Figure 1:
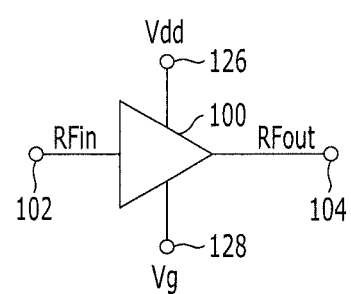
FIG. 1 is a schematic circuit diagram illustrating a structure of a high power amplifier (HPA) in a communication system.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The present invention provides an amplifier for amplifying a radio frequency (RF) signal, and an apparatus and method for controlling the amplifier in a communication system. Exemplary embodiments of the present invention provide an amplifier for stably amplifying an RF signal to a high power (hereinafter referred to as a high power amplifier (HPA)), and an apparatus for normally controlling the HPA even in a variable communication environment (e.g., a switching bias circuit).

Also, in an exemplary embodiment of the present invention, an HPA for amplifying an RF signal to a high power and an apparatus for controlling the HPA (i.e., a switching bias circuit) are implemented in a monolithic microwave integrated circuit (MMIC). That is, in an exemplary embodiment of the present invention, an HPA and an apparatus for controlling the HPA (i.e., a switch bias circuit) are implemented in an MMIC. Accordingly, the HPA can stably amplify an RF signal to a high power, and the switching bias circuit can normally control the HPA.

Also, in an exemplary embodiment of the present invention, the HPA and the switching bias circuit are implemented in a single chip of the MMIC, thus making it possible to simplify an external interface, to reduce the size of a transistor module in the system and to reduce the complexity and size of the entire system. In an exemplary embodiment of the present invention, it can be integrated to the minimum size in a single chip because it need not provide additional external devices and power supply for an amplification operation of the HPA. Also, the present invention is applicable to various applications because a high power amplification operation can be stably performed not only by a TTL (Transistor Transistor Logic) control signal but also by an LVTTL (low Voltage TTL) control signal. The following description focuses on an HPA for amplifying an RF signal of a microwave band to a high level power, and a switching bias circuit of the HPA. However, an amplifier and a scheme for controlling the amplifier in accordance with the present invention are also applicable to the amplification of signals of other bands. Hereinafter, an HPA in a communication system will be described in detail with reference to FIG. 1.

FIG. 1 is a schematic circuit diagram illustrating a structure of a high power amplifier (HPA) in a communication system.

Referring to FIG. 1, the HPA includes an amplifier 100 that is configured to receive an RF signal through an input terminal (RFin) 102, amplify the RF signal to a predetermined level of high power and output the amplified RF signal through an output terminal (RFout) 104. The amplifier 100 receives a drain voltage Vdd from a first power supply for driving a drain by an external power supply (e.g., a positive (+) power) through a first power supply terminal (e.g., a drain voltage terminal 126), and receives a gate voltage Vg from a second power supply for driving a gate (e.g., a negative (−) power) through a second power supply terminal (e.g., a gate voltage terminal 128). Hereinafter, an apparatus for controlling the HPA will be described in detail with reference to FIG. 2.

Figure 2:
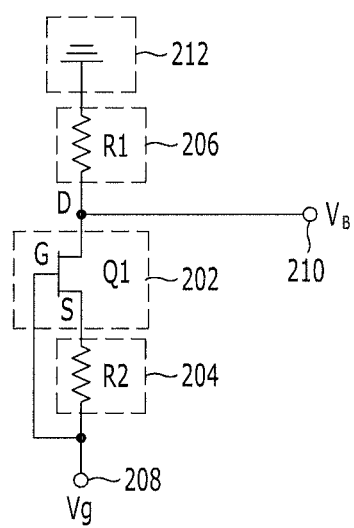
FIG. 2 is a schematic circuit diagram illustrating a structure of an apparatus for controlling an HPA in a communication system.

FIG. 2 is a schematic circuit diagram illustrating a structure of an apparatus for controlling an HPA in a communication system. FIG. 2 illustrates a gate bias circuit as the HPA controlling apparatus.

Referring to FIG. 2, the HPA controlling apparatus includes: a transistor (Q1) 202 operating in a saturation region as an active gate bias circuit; and a first resistor (R1) 206 and a second resistor (R2) 204 connected to a drain terminal D and a source terminal S of the transistor 202. The first resistor 206 is connected between a ground terminal 212 and the drain terminal. The second resistor 204 is connected between the source terminal and a gate voltage terminal 208 to which a gate voltage Vg is applied as a negative power voltage.

In the HPA controlling apparatus, the second resistor 204 is connected as a feedback resistor to the transistor 202, so that the transistor 202 operates in a saturation region. A current is generated at the drain terminal of the transistor 202 and flows from the ground terminal 212 to the gate terminal 208. By the current, a voltage drop occurs across the first resistor 206. A bias voltage $V_B$ resulting from the voltage drop is outputted from an output terminal 210 of the HPA controlling apparatus, and is supplied to the second power supply terminal of the amplifier 100 (i.e., the gate voltage terminal 128) to which the gate voltage Vg is applied as a negative power voltage fro the HPA.

That is, the HPA controlling apparatus (i.e., the active gate bias circuit) supplies the bias voltage $V_B$ to the gate voltage terminal 128 in the amplifier 100 of the HPA by the gate voltage Vg. Accordingly, the HPA amplifies an RF signal, inputted through the input terminal 102, to a high power by the bias voltage $V_B$, and outputs the amplified RF signal through the output terminal 104. Hereinafter, an HPA in a communication system in accordance with an exemplary embodiment of the present invention will be described in detail with reference to FIG. 3.

Figure 3:
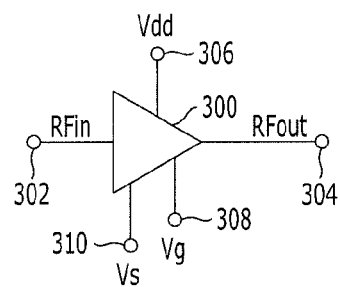
FIG. 3 is a schematic circuit diagram illustrating a structure of an HPA in a communication system in accordance with an exemplary embodiment of the present invention.

FIG. 3 is a schematic circuit diagram illustrating a structure of an HPA in a communication system in accordance with an exemplary embodiment of the present invention.

Referring to FIG. 3, an HPA in accordance with an exemplary embodiment of the present invention is an amplifier implemented by an MMIC. The HPA includes an amplifier 300 that is configured to receive an RF signal through an input terminal (RFin) 302, amplify the RF signal to a predetermined level of high power and output the amplified RF signal through an output terminal (RFout) 304. The amplifier 300 receives a drain voltage Vdd from a first power supply for driving a drain by an external power supply (e.g., a positive (+) power) through a first power supply terminal (e.g., a drain voltage terminal 306), receives a gate voltage Vg from a second power supply for driving a gate (e.g., a negative (−) power) through a second power supply terminal (e.g., a gate voltage terminal 308), and receives a switching voltage Vs from a third power supply for a gate switching operation (e.g., a switching power) through a third power supply terminal (e.g., a switching voltage terminal 310).

In the HPA in accordance with an exemplary embodiment of the present invention, a switching operation of the HPA is implemented using a TTL switching voltage that provides a logic high level of about 5V and a logic low level of about 0V. Also, the HPA and the HPA controlling apparatus are implemented in an MMIC single chip. Hereinafter, an HPA controlling apparatus in accordance with an exemplary embodiment of the present invention will be described in detail with reference to FIG. 4.

Figure 4:
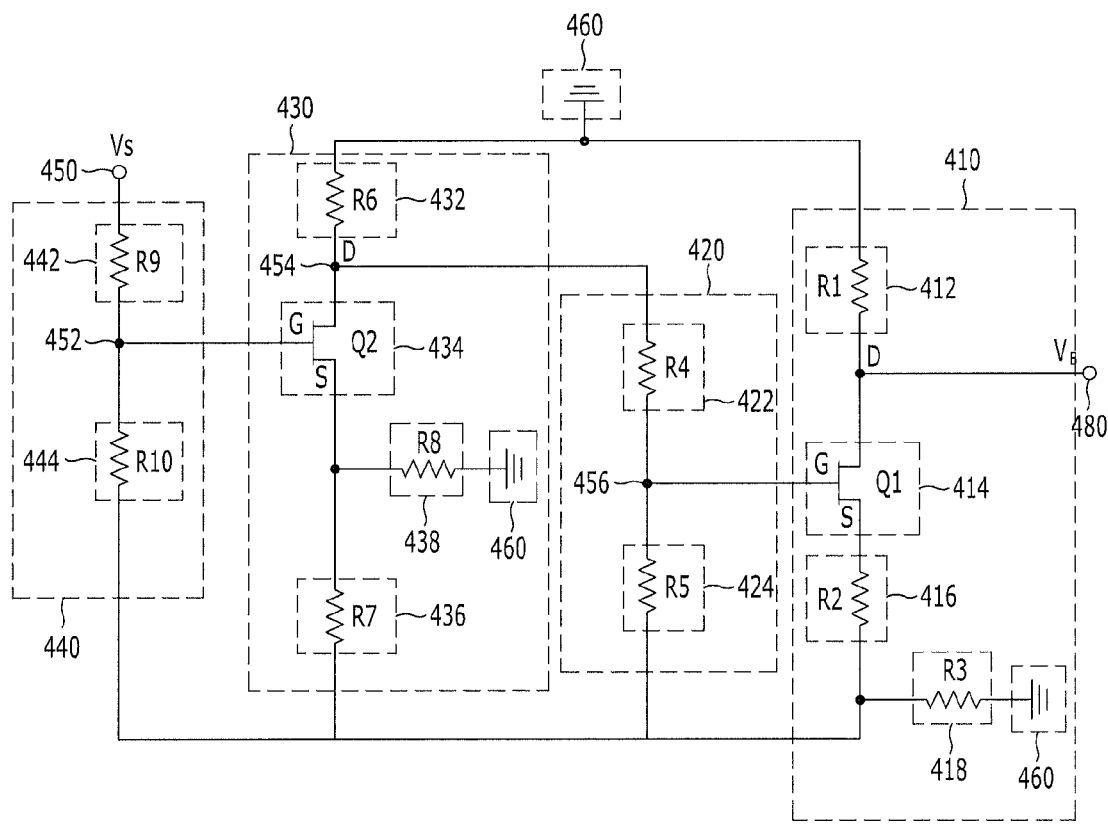
FIG. 4 is a schematic circuit diagram illustrating a structure of an apparatus for controlling an HPA in a communication system in accordance with an exemplary embodiment of the present invention.

FIG. 4 is a schematic circuit diagram illustrating a structure of an apparatus for controlling an HPA in a communication system in accordance with an exemplary embodiment of the present invention.

Referring to FIG. 4, an HPA controlling apparatus in accordance with an exemplary embodiment of the present invention is a switching bias circuit implemented in MMIC. The HPA controlling apparatus includes: a first shifter 440 configured to level-shift a switching voltage Vs applied from an external device; a generating unit 430 configured to output an output voltage of the first shifter 440 as a voltage of a predetermined level; a second shifter 420 configured to level-shift an output voltage of the generating unit 430; and a switching bias unit 410 configured to convert an output voltage of the second shifter 420 into a bias voltage VB and provide a gate voltage of the HPA.

The switching voltage Vs applied from the external device means the third power supply (i.e., the switching power) for a gate switching operation of the amplifier 300 in the HPA, that is, the voltage applied to the switching terminal 310 of the amplifier 300. The bias voltage $V_B$ outputted from the second shifter 420 is a driving voltage for driving the HPA. When receiving the switching voltage Vs, the HPA controlling apparatus supplies the bias voltage $V_B$ as the gate voltage Vg of the amplifier 300 in the HPA to the second power terminal, that is, the gate voltage terminal 308.

The first shifter 440 receives a switching voltage Vs for a switching operation of the amplifier 300 of the HPA from an external device through an input terminal 450, and level-shifts the switching voltage Vs by a ninth resistor (R9) 442 and a tenth resistor (R10) 444. The first shifter 440 includes the ninth resistor 442 and the tenth resistor 444 that are connected in series between the input terminal 450 and the second power terminal of the amplifier 300 of the HPA (i.e., a gate voltage (Vg) terminal 470).

That is, the ninth resistor 442 and the tenth resistor 444 are connected in series between the input terminal 450 to which the TTL switching voltage Vs is applied and the gate voltage terminal 470 to which a negative voltage is applied. The switching voltage Vs is level-shifted by the ninth resistor 442 and the tenth resistor 444, and the level-shifted voltage Vt1 is inputted to a second transistor (Q2) 434 of the generating unit 430 through an output terminal 452 of the first shifter 440. The output terminal 452 of the first shifter 440 serves as the connection terminal of the ninth resistor 442 and the tenth resistor 444.

The generating unit 430 serves as an inverter. The generating unit 430 receives a first voltage Vt1 outputted from the first shifter 440, generates a second voltage Vt2 of a predetermined level, and outputs the same to the second shifter 430. The generating unit 430 includes: a sixth resistor (R6) 432, a second transistor (Q2) 434 and a seventh resistor (R7) 436 connected in series between a ground terminal 460 and the gate voltage terminal 470; and an eighth resistor (R8) 438 connected between the ground terminal 460 and a source terminal S of the second transistor 434.

The generating unit 430 outputs a second voltage Vt2 by inverting a level-shifted voltage (i.e., a first voltage Vt1) outputted from the first shifter 440. Also, in order to use the second transistor 434 as an inverter, the generating unit 430 generates a voltage level of the source terminal of the second transistor 434 between a ground voltage and the gate voltage Vg through the seventh resistor 436 and the eighth resistor 438 so that the voltage level of the first voltage Vt1 outputted from the first shifter 1 is lower than the voltage level of the source terminal S of the second transistor 434. Accordingly, the generating unit 430 generates the second voltage Vt2 of a predetermined level by using the first voltage Vt1 outputted from the first shifter 440 inputted to the gate terminal of the second transistor 434, and outputs the second voltage Vt2 to the second shifter 420 by using a drain terminal D of the second transistor 434 as an output terminal 454.

The second shifter 420 receives the second voltage Vt2 outputted by using the drain terminal D of the second transistor 434 as the output terminal 454, and level-shifts the second voltage Vt2 by a fourth resistor (R4) 422 and a fifth resistor (R5) 424. The second shifter 420 includes the fourth resistor 422 and the fifth resistor 424 that are connected in series between the gate voltage terminal 470 and the output terminal 454 of the generating unit 430.

That is, the fourth resistor 422 and the fifth resistor 424 are connected in series between the output terminal 454, to which the second voltage Vt2 is applied, and the gate voltage terminal 470 to which a negative voltage is applied. The second voltage Vt2 is level-shifted by the fourth resistor 422 and the fifth resistor 424, and the level-shifted third voltage Vt3 is inputted to a first transistor (Q1) 414 of the switching bias unit 410 through an output terminal 456 of the second shifter 420. Herein, the output terminal 456 of the second shifter 420 serves as a connection terminal of the fourth resistor 422 and the fifth resistor 424. The third voltage Vt3 inputted to the first transistor 414 of the switching bias unit 410 corresponds to a voltage that is level-shifted to control the switching bias unit 410.

The switching bias unit 410 outputs a bias voltage $V_B$ as a voltage for driving the amplifier 300 of the HPA. The switching bias unit 410 is controlled by the third voltage Vt3 inputted to the first transistor 414 of the switching bias unit 410. The switching bias unit 410 outputs the bias voltage $V_B$ to the second power supply terminal (i.e., the gate voltage terminal 308) to which a negative voltage is applied. The switching bias unit 410 includes: a first resistor (R1) 412, a first transistor (Q1) 414 and a second resistor (R2) 416 connected in series between the ground terminal 460 and the gate voltage terminal 470; and a third resistor (R3) 418 connected between the ground terminal 460 and a source terminal S of the first transistor 414.

Also, the switching bias unit 410 generates a voltage level of the source terminal of the first transistor 414 between the gate voltage Vg and the ground voltage through the second resistor 416 and the third resistor 418, and generates the bias voltage $V_B$ as the voltage of the drain terminal of the first transistor 414 between the gate voltage Vg and the ground voltage. The bias voltage $V_B$ is outputted through the output terminal 480 as a driving voltage of the HPA. The bias voltage $V_B$ is applied to the second power supply terminal (i.e., the gate voltage terminal 308) of the amplifier 300 of the HPA to drive the HPA.

As described above, the HPA controlling apparatus is implemented in MMIC by using transistors, resistors, inductors and capacitors, and the TTL switching voltage Vs is controlled to a logic high level of about 5 V and a logic low level of about 0 V for a gate switching operation of the HPA. The switching voltage Vs is level-shifted by the first shifter 440. The level-shifted first voltage Vt1 is inputted to the generating unit 430 operating as an inverter. The level-shifted first voltage Vt1 is generated as the second voltage Vt2 of a predetermined level by the generating unit 430. The generated second voltage Vt2 is level-shifted by the second shifter 420 to control the first transistor 414 of the switching bias unit 410. The level-shifted third voltage Vt3 is inputted to the switching bias unit 410. By the switching bias unit 410, the bias voltage $V_B$ for driving the HPA is inputted to the gate voltage terminal 308 of the amplifier 300 to which a negative voltage is applied.

For example, the threshold voltage of the transistor (e.g., a field effect transistor (FET)) included in the HPA is −1.5 V, and the gate voltage for a normal operation of the transistor is −0.95 V to −0.85 V. Therefore, if the voltage applied to the gate voltage terminal 308 of the amplifier 300 of the HPA, that is, the bias voltage $V_B$ outputted from the HPA controlling apparatus to driving the HPA is lower than −1.5 V, a drain current of the HPA becomes 0 A and it does not operate. If the bias voltage $V_B$ is −0.95 V to −0.85 V, a drain current of the HPA flows and operates normally.

Specifically, if the switching voltage Vs inputted to the HPA controlling apparatus is at a logic high level of 5.0 V, the third voltage Vt3 (the output voltage of the second shifter 420 inputted to the switching bias unit 410) becomes a low-level voltage through the generating unit 430 operating as an inverter, so that the drain current of the first transistor 414 of the switching bias unit 410 operates as a small value. Therefore, the voltage level dropped by the first resistor 412 connected to the ground terminal 460 becomes smaller, and the bias voltage $V_B$ with a high level of about −0.9 V is outputted. The bias voltage $V_B$ is inputted to the gate terminal 308, and the HPA operates normally.

If the switching voltage Vs is at a logic low level of 0 V, the third voltage Vt3 (the output voltage of the second shifter 420 inputted to the switching bias unit 410) becomes a high-level voltage through the generating unit 430 operating as an inverter, so that the drain current of the first transistor 414 of the switching bias unit 410 operates as a large value. Therefore, the voltage level dropped by the first resistor 412 connected to the ground terminal 460 becomes larger, and the bias voltage $V_B$ with a low level of about −1.7 V (lower than the threshold voltage of the transistor of the amplifier 300) is outputted. The bias voltage $V_B$ is inputted to the gate terminal 308, and the HPA does not operate, thus minimizing the power consumption of the HPA. Hereinafter, a bias voltage $V_B$ outputted from an HPA controlling apparatus in a communication system in accordance with an exemplary embodiment of the present invention will be described in detail with reference to FIG. 5.

Figure 5:
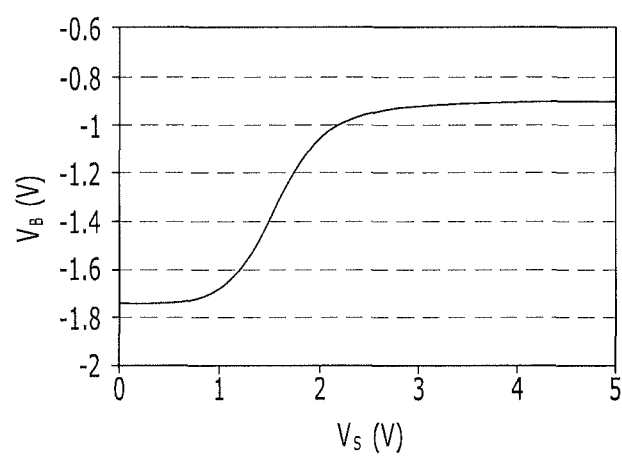
FIG. 5 is a graph illustrating an output voltage of an apparatus for controlling an HPA in a communication system in accordance with an exemplary embodiment of the present invention.

FIG. 5 is a graph illustrating an output voltage of an apparatus for controlling an HPA in a communication system in accordance with an exemplary embodiment of the present invention. FIG. 5 illustrates the level of a bias voltage $V_B$ outputted from the HPA controlling apparatus according to the level of a switching voltage Vs inputted to the HPA controlling apparatus.

Referring to FIG. 5, when the switching voltage Vs inputted through the input terminal 450 of the HPA controlling apparatus has a logic low level of about 0 V to about 0.7 V, the bias voltage $V_B$ outputted through the output terminal 480 of the HPA controlling apparatus has a voltage level of about −1.75 V that is lower than a threshold voltage −1.5 V of the HPA. Accordingly, the current of the drain terminal of the HPA is 0 A and the HPA does not operate.

Also, when the switching voltage Vs inputted through the input terminal 450 has a logic high level of about 3 V to about 5 V, the bias voltage $V_B$ outputted through the output terminal 480 has a voltage level of about −0.9 V and an operation voltage 0.9 V of the HPA is supplied to the gate voltage terminal 308 of the HPA. Accordingly, a current flows through the drain terminal of the HPA and the HPA operates normally. When the switching voltage Vs inputted through the input terminal 450 operates from about 3 V to a logic high level, it also operates at about 3.3 V (i.e., a logic high level of the LVTTL). Therefore, the HPA and the HPA controlling apparatus can be stably operated by various control signals such as a TTL control signal and a LVTTL control signal. Accordingly, they are applicable to various applications. That is, the HPA controlling apparatus drives the gate switching operation of the HPA by a TTL control signal and an LVTTL control signal.

As described above, the present invention implements an amplifier, which is configured to stably amplifying an RF signal to a high power in a communication system, in an MMIC (Monolithic Microwave Integrated Circuit), thereby making it to normally control the amplifier, to simplify an external interface and to reduce the size of a transistor module.

Accordingly, the present invention can reduce the complexity and size of the entire system and can implement the integration to the minimum size in a single chip because it need not provide additional external devices and power supply for amplification of an RF signal. Also, the present invention is applicable to various applications because it is stably operated not only by a TTL (Transistor Transistor Logic) control signal but also by an LVTTL (low Voltage TTL) control signal.

While the present invention has been described with respect to the specific embodiments, it will be apparent to those skilled in the art that various changes and modifications may be made without departing from the spirit and scope of the invention as defined in the following claims.

What is claimed is:

1. An apparatus for controlling an amplifier in a communication system, comprising:
   a first shifter configured to level-shift a switching voltage of an amplifier to a first voltage;
   a generating unit configured to invert the first voltage and output a second voltage;

a second shifter configured to level-shift the second voltage to a third voltage; and a switching bias unit configured to receive the third voltage and output a bias voltage for a gate switching operation of the amplifier to the amplifier, wherein for the gate switching operation of the amplifier, a positive voltage is applied to a drain voltage terminal of the amplifier, the switching voltage is applied to a switching terminal of the amplifier, and the bias voltage with a negative voltage level is applied to a gate voltage terminal of the amplifier.

2. The apparatus of claim 1, wherein the first shifter comprises a first resistor and a second resistor connected in series between the switching terminal and the gate voltage terminal, wherein the switching voltage is inputted to the first resistor, and the first voltage is outputted from a connection terminal of the first resistor and the second resistor.

3. The apparatus of claim 1, wherein the generating unit comprises:
a first resistor, a transistor and a second resistor connected in series between a ground terminal and the gate voltage terminal; and
a third resistor connected between the ground terminal and a connection terminal of the second resistor and the transistor,
wherein the first resistor is connected to a drain terminal of the transistor, and the second resistor and the third resistor are connected to a source terminal of the transistor.

4. The apparatus of claim 3, wherein the generating unit is configured to receive the first voltage through the gate terminal of the transistor and output the second voltage from the drain terminal of the transistor.

5. The apparatus of claim 3, wherein the generating unit generates a source terminal voltage of the transistor between a ground voltage and a gate voltage of the amplifier through the second resistor and the third resistor.

6. The apparatus of claim 1, wherein the second shifter comprises a first resistor and a second resistor connected in series between the gate voltage terminal and an output terminal of the generating unit,
wherein the second voltage is inputted to the first resistor, and the third voltage is outputted from a connection terminal of the first resistor and the second resistor.

7. The apparatus of claim 1, wherein the switching bias unit comprises:
a first resistor, a transistor and a second resistor connected in series between a ground terminal and the gate voltage terminal; and
a third resistor connected between the ground terminal and a connection terminal of the second resistor and the transistor,
wherein the first resistor is connected to a drain terminal of the transistor, and the second resistor and the third resistor are connected to a source terminal of the transistor.

8. The apparatus of claim 7, wherein the switching bias unit is configured to receive the third voltage through the gate terminal of the transistor and output the bias voltage from the drain terminal of the transistor.

9. The apparatus of claim 8, wherein the switching bias unit is controlled by the third voltage to generate a source terminal voltage of the transistor between a ground voltage and a gate voltage of the amplifier through the second resistor and the third resistor.

10. The apparatus of claim 8, wherein the switching bias unit is controlled by the third voltage to generate the bias voltage dropped by the first resistor and generate a drain terminal voltage of the transistor as the bias voltage between a ground voltage and a gate voltage of the amplifier.

11. The apparatus of claim 1, wherein if the switching voltage is at a high level, the bias voltage higher than a threshold voltage of a transistor included in the amplifier is outputted to normally operate the amplifier, and
if the switching voltage is at a low level, the bias voltage lower than the threshold voltage is outputted not to operate the amplifier.

12. An amplifier in a communication system, comprising:
an amplifying unit configured to amplify a radio frequency (RF) signal to a high power; and
a driving unit configured to apply a bias voltage to a gate terminal of the amplifying unit for a gate switching operation of the amplifying unit,
wherein the amplifying unit and the driving unit are included in a Monolithic Microwave Integrated Circuit (MMIC);
the amplifying unit receives a positive voltage through a drain voltage terminal for the gate switching operation, receives a switching voltage through a switching terminal, and receives a negative voltage through the gate terminal; and
if the switching voltage is at a high level, the driving unit applies the bias voltage, which is higher than a threshold voltage of a transistor included in the amplifying unit, to normally operate the amplifying unit, and if the switching voltage is at a low level, the driving unit applies the bias voltage lower than the threshold voltage not to operate the amplifying unit.

13. The amplifier of claim 12, wherein the driving unit drives the gate switching operation of the amplifying unit by a TTL (Transister Transister Logic) control signal and an LVTTL (Low Voltage TTL) control signal.

14. The amplifier of claim 12, wherein the driving unit level-shifts the switching voltage, and generates the bias voltage through a voltage drop according to the control of the level-shifted voltage.

15. A method for controlling an amplifier in a communication system, comprising:
level-shifting a switching voltage for a gate switching operation of an amplifier;
inverting the level-shifted switching voltage;
level-shifting the inverted switching voltage;
generating a bias voltage for driving the gate switching operation of the amplifier by the control of the inverted and level-shifted switching voltage; and
applying the generated bias voltage to the amplifier,
wherein, in said applying the generated bias voltage to the amplifier, for the gate switching operation of the amplifier, a positive voltage is applied to a drain voltage terminal of the amplifier, the switching voltage is applied to a switching terminal of the amplifier, and the bias voltage with a negative voltage level is applied to a gate voltage terminal of the amplifier.

16. The method of claim 15, wherein, in said applying the generated bias voltage to the amplifier,
if the switching voltage is at a high level, the bias voltage higher than a threshold voltage of the transistor included in the amplifier is applied to normally operate the amplifier, and
if the switching voltage is at a low level, the bias voltage lower than the threshold voltage is applied not to operate the amplifier.

17. The method of claim 15, wherein, in said applying the generated bias voltage to the amplifier, the bias voltage is applied by a TTL (Transister Transister Logic) control signal and an LVTTL (Low Voltage TTL) control signal to drive the gate switching operation of the amplifier.

18. The method of claim 15, wherein, in said generating the bias voltage,
the bias voltage is generated through a voltage drop according to the control of the switching voltage.

* * * * *